United States Patent [19]

Higuchi

[11] Patent Number: 5,106,780

[45] Date of Patent: Apr. 21, 1992

[54] SEMICONDUCTOR DEVICE AND METHOD OF MANUFACTURING THE SAME

[75] Inventor: Takayoshi Higuchi, Sendai, Japan

[73] Assignee: Kabushiki Kaisha Toshiba, Kawasaki, Japan

[21] Appl. No.: 648,515

[22] Filed: Jan. 30, 1991

Related U.S. Application Data

[62] Division of Ser. No. 388,037, Aug. 1, 1989, Pat. No. 5,014,109.

Foreign Application Priority Data

[30]

Aug. 5, 1988 [JP] Japan .................. 63-194572

[51] Int. Cl.⁵ ................. H01L 21/44; H01L 21/48
[52] U.S. Cl. .................... 437/189; 437/195
[58] Field of Search ........... 437/189, 195, 203, 974, 437/978; 357/71, 23.9

[56] References Cited

U.S. PATENT DOCUMENTS

| | | |
|---|---|---|
| 4,647,850 | 3/1987 | Henderson et al. ...... 148/DIG. 102 |
| 4,656,732 | 4/1987 | Teng et al. ............. 156/643 |
| 4,737,831 | 4/1988 | Iwai ...................... 357/23.9 |
| 4,900,695 | 2/1990 | Takahashi et al. .......... 437/189 |

*Primary Examiner*—Robert Kunemund
*Assistant Examiner*—Loc Q. Trinh
*Attorney, Agent, or Firm*—Finnegan, Henderson, Farabow, Garrett and Dunner

[57] ABSTRACT

The present invention provides a semiconductor device, comprising a substrate, a first insulation layer formed on the substrate, a first wiring layer formed on the first insulation layer, a second insulation layer formed on the first wiring layer and having a contact hole, and a third insulation layer formed on the second insulation layer, said third insulation layer being in contact with the first wiring layer via the contact hole.

2 Claims, 2 Drawing Sheets

SEMICONDUCTOR DEVICE AND METHOD OF MANUFACTURING THE SAME

This is a division of application Ser. No. 07/388,037, filed Aug. 1, 1989, now U.S. Pat. No. 5,014,109 iss. date May 7, 1991.

BACKGROUND OF THE INVENTION

1. Field of the Invention

The present invention relates to a semiconductor device and a method of manufacturing the same, particularly, to a method of connecting multi-layered wiring layers.

2. Description of the Related Art

In a semiconductor device using multi-wiring layers, connection of wiring layers is performed in general by making contact holes in an interlayer insulation layer. FIGS. 3A and 3B collectively show an example of the conventional contact structure of a MOS type semiconductor device for connecting a first wiring layer formed of polycrystalline silicon, said first wiring layer providing a gate electrode, to a second wiring layer formed of a metal.

As seen from FIG. 3A, which is a cross sectional view along the channel region of the MOS transistor, a field oxide layer 2 is selectively formed on the surface of a p-type silicon substrate 1 such that the element region of the MOS transistor is surrounded by the field oxide layer 2. As seen from FIG. 3B, which is a plan view, N+-type source and drain regions 3 and 4 are formed apart from each other within the element region with the channel region positioned therebetween. A gate electrode 6 formed of polycrystalline silicon is formed above the channel region with a gate oxide layer 5 interposed therebetween. The gate electrode 6 extends to cover partly the field oxide layer 2 and is covered with an interlayer insulation layer 7 formed of silicon dioxide by CVD. Further, an aluminum wiring layer is formed on the interlayer insulation layer 7. A contact hole 8 is formed in the interlayer insulation layer 7 for bringing the aluminum wiring layer into contact with the gate electrode 6. A reactive ion etching (RIE) is employed for forming the contact hole 8 in accordance with miniaturization of the element. In this case, it is necessary to provide an allowance A in the contact portion of the gate electrode 6 as shown in FIG. 3B in view of the deviation in the mask alignment in the step of PEP (photoetcing process) for forming the contact hole. Naturally, the allowance A inhibits miniaturization of the semiconductor device.

Where the allowance A is not provided, it is possible for the contact hole 8 to extend beyond the gate electrode 6 because of the deviation in the mask alignment, as shown in FIG. 4. In this case, the field oxide layer 2 is also etched in the step of RIE, with the result that an aluminum wiring 9 is brought into electric contact with the silicon substrate 1. In other words, short-circuiting takes place.

SUMMARY OF THE INVENTION

An object of the present invention is to provide a semiconductor device having multi-wiring layers formed on a semiconductor substrate, which permits miniaturizing the device and, thus, improving the degree of integration without bringing about short-circuiting between the wiring layers and the semiconductor substrate.

According to the present invention, there is provided a semiconductor device, comprising a substrate, a first insulation layer formed on the substrate, a first wiring layer formed on the first insulation layer, a second insulation layer formed on the first wiring layer and having a contact hole, said contact hole being provided with a portion passing through said first insulation layer and first wiring layer and reaching said substrate, and a third insulation layer formed on the substrate; which fills the portion of said contact hole.

An allowance is certainly provided in the step of forming the contact hole in view of the deviation in the mask alignment. In the present invention, however, it is possible to minimize the allowance, leading to a miniaturization and an improved degree of integration of the device. To be more specific, deviation of the contact hole may possibly cause the field oxide layer to be etched to form a small groove in the field oxide layer such that the groove extends to reach the substrate. In the present invention, however, the groove, even if formed, is filled with the third insulation layer. It follows that a second wiring layer filling the contact hole is prevented from contacting the substrate, even if the contact hole is positioned beyond the edge of the first wiring layer. The particular construction permits minimizing the allowance of the contact hole, leading to miniaturization and improved integration degree of the semiconductor device.

DETAILED DESCRIPTION OF THE PREFERRED EMBODIMENTS

Figure 1A:
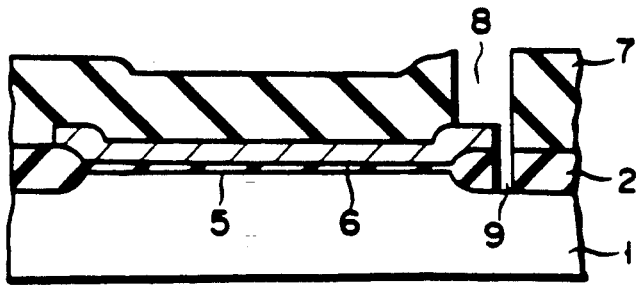
FIGS. 1A to 1C are cross sectional views collectively showing the process of manufacturing a semiconductor device according to one embodiment of the present invention.
Figure 1B:
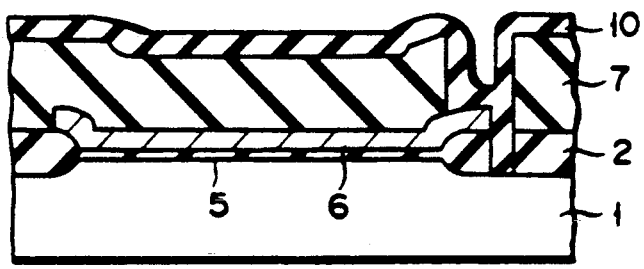
Figure 1C:
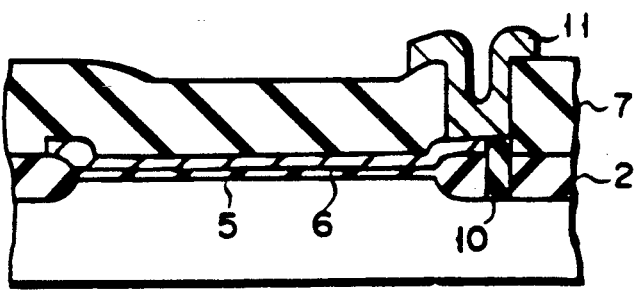
Figure 3A:
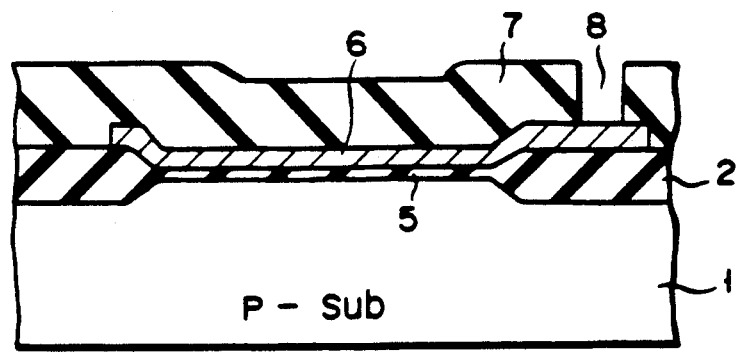
FIG. 3A is a cross sectional view showing a semiconductor device produced by a conventional method.
Figure 3B:
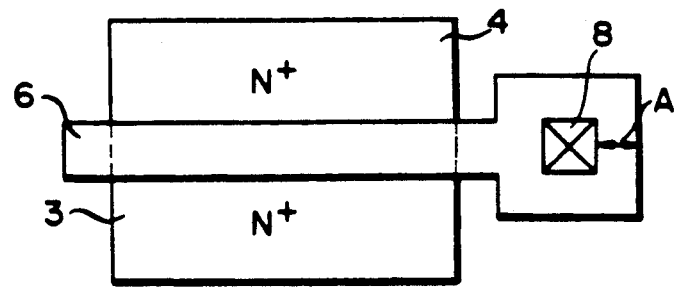
FIG. 3B is a plan view showing a semiconductor device produced by a conventional method.
Figure 4:
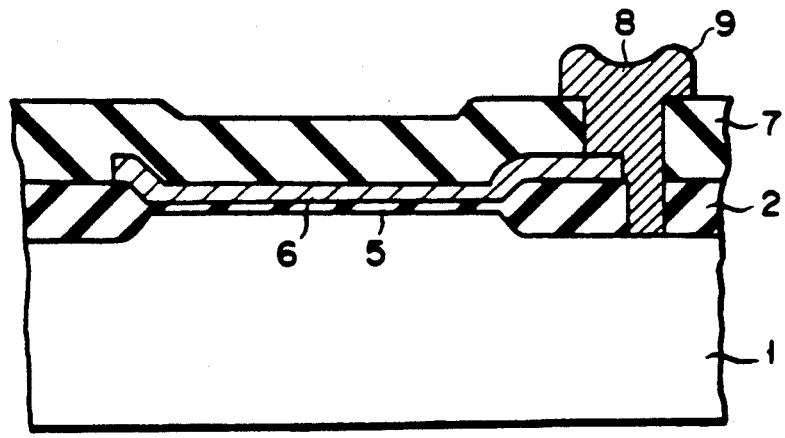
FIG. 4 is a cross sectional view showing a defect accompanying a semiconductor device produced by a conventional method.

A semiconductor device according to one embodiment of the present invention is manufactured as shown in FIGS. 1A to 1C. The device shown in these drawings corresponds to the conventional device shown in FIG. 3 and, thus, the reference numerals common with these drawings denote the same members of the device.

Figure 2:
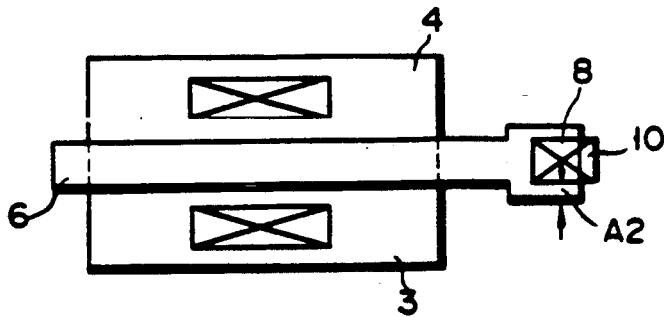
FIG. 2 is a plan view showing the gist portion of the device shown in FIG. 1.

As shown in FIG. 1A, a field oxide layer 2 is formed on a P-type silicon substrate 1. Then, an N+-type source region 3, an N+-type drain region 4, and a gate oxide layer 5 are formed as shown in FIG. 2, which is a plan view, followed by forming a gate electrode 6 formed of polycrystalline silicon layer doped with an impurity. Further, an interlayer insulation layer 7 is deposited on the gate electrode 6, followed by forming a contact hole 8 in the insulation layer 7 by an anisotropic etching using a resist pattern. In forming the contact hole 8, an allowance A2 in the width of the contact portion with the gate electrode 6 is set small for miniaturizing the semiconductor device. Thus, if a deviation takes place in the mask alignment, the field insulation layer 2 is also etched near the periphery of the gate electrode 6 so as to form a groove 9 extending downward to reach the substrate 1.

In the next step, an insulation layer 10, e.g., a silicon nitride layer or a silicon dioxide layer, is deposited on the entire surface in a thickness of 1500 Å by means of low pressure CVD, as shown in FIG. 1B. If the thickness of the insulation layer 10 is at least half the width of the groove 9, the groove 9 is completely filled with the insulation layer 10. The insulation layer 10 is then removed by an isotropic etching, as shown in FIG. 1C. If the depth of the groove 9 is markedly larger than the width thereof, the insulation layer 10 is left unremoved selectively within the groove 9 in this etching step. Finally, an aluminum layer is formed on the entire surface, followed by patterning the aluminum layer so as to form an aluminum wiring 11.

In the embodiment described above, the groove 9 is filled with the insulation layer 10, e.g., a silicon nitride layer, with the result that the short-circuit between the aluminum wiring 11 and the silicon substrate 1 can be prevented. In addition, the allowance A2 in the contact portion of the gate wiring 6 can be diminished, leading to miniaturization and high integration degree of the semiconductor device.

The technical idea of the present invention can be applied not only to the semiconductor device described above but also to any type of devices requiring miniaturization and also requiring a measure for preventing short-circuit between the conductor within the contact hole and the semiconductor substrate.

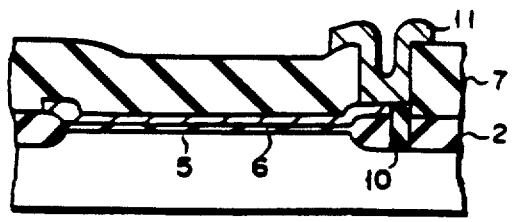

What is claimed is:

1. A method of manufacturing a semiconductor device, comprising:
   a first step of forming a first insulation layer on a substrate;
   a second step of forming a first wiring layer on the first insulation layer;
   a third step of forming a second insulation layer on the first wiring layer;
   a fourth step of forming a contact hole in the second insulation layer and a groove in the first insulation layer extending from said contact hole to the substrate;
   a fifth step of forming a third insulation layer on the entire surface of the substrate with a portion thereof filling the groove; and
   a sixth step of selectively etching the third insulation layer to leave the portion of the third insulation layer in the groove.

2. The method of manufacturing a semiconductor device according to claim 1, further comprising a seventh step of forming a second wiring layer filling the contact hole.

* * * * *

UNITED STATES PATENT AND TRADEMARK OFFICE
CERTIFICATE OF CORRECTION

PATENT NO. : 5,106,780
DATED : April 21, 1992
INVENTOR(S) : Takayoshi Higuchi

It is certified that error appears in the above-indentified patent and that said Letters Patent is hereby corrected as shown below:

On the cover sheet of the patent change the illustrative figure to read as shown on the attached sheet.

Signed and Sealed this

Eighteenth Day of January, 1994

*Attest:*

BRUCE LEHMAN

*Attesting Officer*  Commissioner of Patents and Trademarks

United States Patent [19]
Higuchi

[11] Patent Number: 5,106,780
[45] Date of Patent: Apr. 21, 1992

[54] SEMICONDUCTOR DEVICE AND METHOD OF MANUFACTURING THE SAME

[75] Inventor: Takayoshi Higuchi, Sendai, Japan

[73] Assignee: Kabushiki Kaisha Toshiba, Kawasaki, Japan

[21] Appl. No.: 648,515

[22] Filed: Jan. 30, 1991

Related U.S. Application Data

[62] Division of Ser. No. 388,037, Aug. 1, 1989, Pat. No. 5,014,109.

[30] Foreign Application Priority Data

Aug. 5, 1988 [JP]  Japan .................................. 63-194572

[51] Int. Cl.$^5$ ....................... H01L 21/44; H01L 21/48
[52] U.S. Cl. ..................................... 437/189; 437/195
[58] Field of Search ............... 437/189, 195, 203, 974, 437/978; 357/71, 23.9

[56] References Cited

U.S. PATENT DOCUMENTS

| | | | |
|---|---|---|---|
| 4,647,850 | 3/1987 | Henderson et al. | 148/DIG. 102 |
| 4,656,732 | 4/1987 | Teng et al. | 156/643 |
| 4,737,831 | 4/1988 | Iwai | 357/23.9 |
| 4,900,695 | 2/1990 | Takahashi et al. | 437/189 |

Primary Examiner—Robert Kunemund
Assistant Examiner—Loc Q. Trinh
Attorney, Agent, or Firm—Finnegan, Henderson, Farabow, Garrett and Dunner

[57] ABSTRACT

The present invention provides a semiconductor device, comprising a substrate, a first insulation layer formed on the substrate, a first wiring layer formed on the first insulation layer, a second insulation layer formed on the first wiring layer and having a contact hole, and a third insulation layer formed on the second insulation layer, said third insulation layer being in contact with the first wiring layer via the contact hole.

2 Claims, 2 Drawing Sheets